United States Patent [19]

Chen

[11] Patent Number: 4,730,126

[45] Date of Patent: Mar. 8, 1988

[54] TEMPERATURE COMPENSATED HIGH PERFORMANCE HYSTERESIS BUFFER

[75] Inventor: Martin Chen, Foster City, Calif.

[73] Assignee: Advanced Micro Devices, Inc., Sunnyvale, Calif.

[21] Appl. No.: 900,965

[22] Filed: Aug. 27, 1986

[51] Int. Cl.$^4$ .................. H03K 17/14; H03K 17/30
[52] U.S. Cl. .................. 307/290; 307/443; 307/456; 307/359; 307/563; 307/310
[58] Field of Search ............... 307/443, 456, 458, 491, 307/359, 547, 549, 563, 290, 310, 317 A

[56] References Cited

U.S. PATENT DOCUMENTS

| | | | |
|---|---|---|---|
| 4,384,219 | 5/1983 | Davis | 307/359 X |
| 4,390,799 | 6/1983 | Schmoock | 307/310 |
| 4,406,955 | 9/1983 | Lo Cascio | 307/359 X |
| 4,501,976 | 2/1985 | West et al. | 307/456 |
| 4,562,362 | 12/1985 | Stenbock | 307/359 X |
| 4,567,380 | 1/1986 | Yasuda et al. | 307/359 X |
| 4,581,545 | 4/1986 | Beale et al. | 307/359 X |
| 4,620,115 | 10/1986 | Lee et al. | 307/443 |

FOREIGN PATENT DOCUMENTS 0037759 3/1977 Japan .................. 307/359

OTHER PUBLICATIONS

Frye, "Elimination of Hysteresis in the Schmitt Trigger", *IBM T.D.B.*, vol. 8, No. 1, Jun. 1965, pp. 204–205 (307/290).

*Primary Examiner*—Stanley D. Miller
*Assistant Examiner*—D. R. Hudspeth
*Attorney, Agent, or Firm*—Patrick T. King; Joseph K. Kaliko; J. Vincent Tortolano

[57] ABSTRACT

A hysteresis circuit is disclosed in which a first signal path, including a hysteresis feedback loop, is separate from a second signal path that is used to carry data. When the signal input to the hysteresis circuit (also referred to hereinafter as the "input signal") crosses a first preselected hysteresis reference of ("threshold") level, the hysteresis feedback loop, which includes threshold adjustment means, will cause a change in the threshold from the first preselected level to a second preselected level. This adjustment of threshold level will take place in parallel with the data being propagated to the output over said separate second signal path. A subsequent crossing of the second preselected threshold level by said input signal will cause the first threshold level to the reset and so on. According to the preferred embodiment of the invention, the threshold adjustment means included in said first signal path further includes a temperature compensation string, current switching means and means which act as an antihysteresis killer to speed up the operation of the hysteresis circuit. This novel combination is operative to assure a preselected minimum hysteresis window over the 210° C. temperature range between −55° C. and 155° C., and renders the hysteresis circuit suitable for use in both military applications and other hostile environments. Furthermore, according to the preferred embodiment of the invention, the hysteresis cirucit has a PNP input stage to reduce $I_{IL}$ and accordingly improve the input chracteristics of the circuit, particularly fan-in. The circuit also features a low $I_{CC}$ and is designed to be self-compensating with respect to manufacturing disparities inherent in components used to fabricate the circuit itself.

20 Claims, 6 Drawing Figures

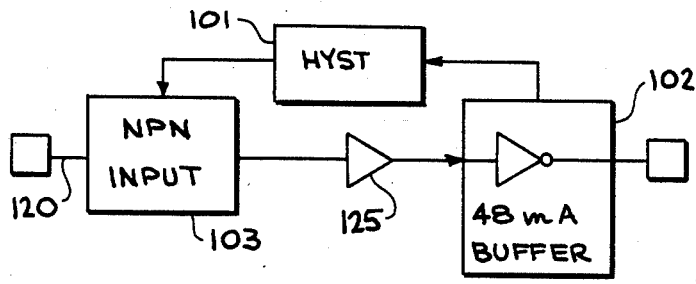
FIG. 1A
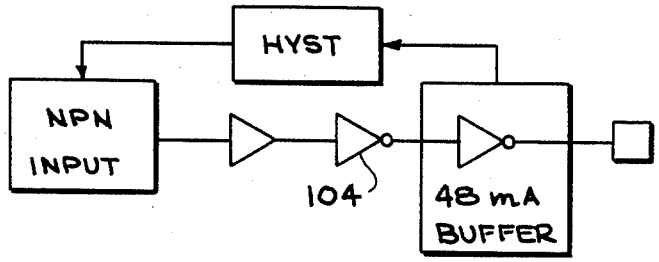
FIG. 1B
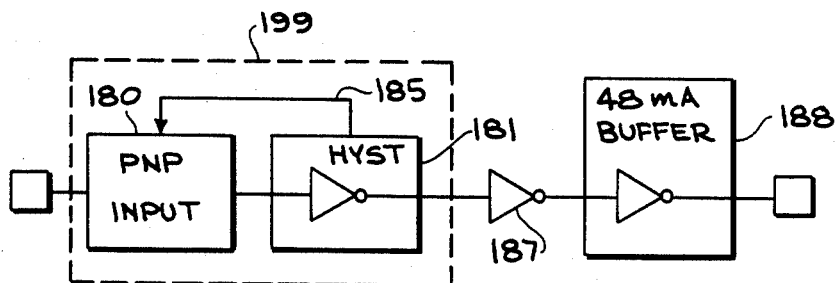
FIG. 1C
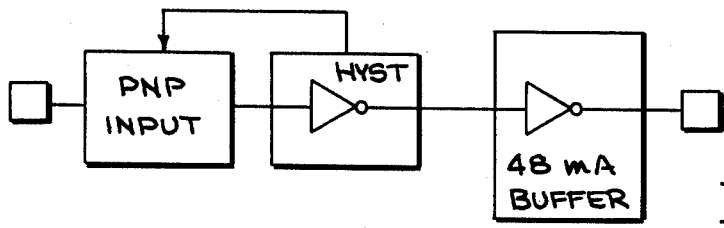
FIG. 1D
| IN | Q1 | Q2 | Q3 | Q4 | Q5 | Q6 | Q7 | Q8 | Q9 | OUT |
|----|----|----|----|----|----|----|----|----|----|-----|
| LOW | ON | ON | OFF | OFF | OFF | ON | OFF | OFF | OFF | HIGH |
| HIGH | OFF | OFF | ON | ON | OFF | OFF | ON | ON | ON | LOW |
FIG. 3

TEMPERATURE COMPENSATED HIGH PERFORMANCE HYSTERESIS BUFFER

BACKGROUND OF THE INVENTION

1. Field of the Invention

The invention generally relates to hysteresis circuits. More particularly, the invention relates to high-speed temperature compensated hysteresis circuits which guarantee a predetermined minimum hysteresis window over a wide temperature range so that the circuits are suitable for use in military applications and hostile environments.

2. Description of the Related Art

Hysteresis circuits are well known devices for accurately detecting a change in the value of an input signal voltage. These circuits operate by varying threshold voltage values so that when the input signal value is "low", a high threshold, $V_{IH}$, is set and when the input signal is "high" a low threshold value $V_{IL}$ is set. By keeping the hysteresis window, i.e., the absolute value of the voltage difference of $V_{IL}$ and $V_{IH}$, above some minimum value, reasonable assurance may be had that noise or transients do not inadvertently cause a threshold boundry to be crossed to yield a false signal that a swing in input signal voltage has occured.

These circuits must operate to detect valid threshold crossings and adjust threshold levels accordingly, i.e., if the $V_{IL}$ threshold is set and crossed the circuit must operate to set the $V_{IH}$ threshold and vice versa.

Known hysteresis circuits are not output independent. Typically, signals output by a hysteresis circuit are also fed back to the circuit itself to set up the hysteresis reference levels (the threshold voltages $V_{IL}$ and $V_{IH}$). As a result, the hysteresis reference levels may be affected by variables in the output stage, for example, output current. It would therefore be desirable to have a hysteresis circuit which operates in parallel with data being propagated to the output stage, independent of the output itself, to eliminate such variables.

Furthermore, it has been determined that it would be desirable to reduce $I_{CC}$, the total current required by a hysteresis circuit, from the $I_{CC}$ levels required by known circuits in order to meet military application specifications.

Still further, it has been determined that it would be desirable to be able to improve the input characteristics of known hysteresis circuits by minimizing $I_{IL}$ ("current when input is low") to, for example, achieve improved fan-in.

Further yet, it would be desirable to insure that hysteresis circuits having all the features set forth hereinbefore assure a minimum preselected hysteresis window over wide temperature ranges. In particular, this feature is desirable over the 210° C. operating range between −55° C. and 155° C. typically required for military applications. This assurance that a minimum preselected hysteresis window can be guaranteed over a wide temperature range would allow for the incorporation of these circuits in hostile environments generally. Known hysteresis circuits simply do not have this capability.

Finally, it would be advantageous if hysteresis circuits having all the features set forth hereinbefore, were self-compensating with respect to the components used to fabricate the circuit itself. A self-compensating feature to account for manufacturing disparities in components would further improve the reliability and accuracy of such circuits.

SUMMARY OF THE INVENTION

A hysteresis circuit is disclosed in which a first signal path, including a hysteresis feedback loop, is separate from a second signal path that is used to carry data. When the signal input to the hysteresis circuit (also referred to hereinafter as the "input signal") crosses a first preselected hysteresis reference (or "threshold") level, the hysteresis feedback loop, which includes threshold adjustment means, will cause a change in the threshold from the first preselected level to a second preselected level. This adjustment of threshold level will take place in parallel with the data being propagated to the output over said separate second signal path. A subsequent crossing of the second preselected threshold level by said input signal will cause the first threshold level to be reset and so on.

According to the preferred embodiment of the invention, the threshold adjustment means included in said first signal path further includes a temperature compensation string, current switching means and means which act as an anti-hysteresis killer to speed up the operation of the hysteresis circuit. This novel combination is operative to assure a preselected minimum hysteresis window over the 210° C. temperature range between −55° C. and 155° C., and renders the hysteresis circuit suitable for use in both military applications and other hostile environments.

Furthermore, according to the preferred embodiment of the invention, the hysteresis circuit has a PNP input stage to reduce $I_{IL}$ and accordingly improve the input characteristics of the circuit, particularly fan-in. The circuit also features a low $I_{CC}$ and is designed to be self-compensating with respect to manufacturing disparities inherent in components used to fabricate the circuit itself.

It is an object of the invention to provide a hysteresis circuit which is capable of adjusting its hysteresis reference level in parallel with data being propagated to the output of the circuit.

It is a further object of the invention to provide a hysteresis circuit that guarantees a minimum preselected hysteresis window over a wide temperature range. In particular, it is an object of the invention to provide a circuit that guarantees a minimum 200 millivolt hysteresis window over the aforementioned 210° C. temperature range to permit the use of said circuit in military applications and in hostile environments.

It is still a further object of the invention to provide a hysteresis circuit which requires a lower $I_{CC}$ and $I_{IL}$ compared with known hysteresis circuits, without reducing the operating speed of the circuit, and which provides for the automatic compensation for manufacturing disparities in components used to fabricate the circuit.

These and other objects and features of the present invention will become apparent to those skilled in the art upon consideration of the following detailed description and the accompanying Drawing, in which like reference designations represent like features throughout the figures.

BRIEF DESCRIPTION OF THE DRAWING

FIGS. 1a–1d depict, in block diagram form, various circuit arrangements incorporating hysteresis buffers. FIGS. 1a and 1b are prior art circuit arrangments which respectively perform inverter and noninverter functions. FIGS. 1c and 1d are the corresponding circuit arrangements incorporating the novel hysteresis buffer taught herein.

FIG. 3 depicts, in tabular form, the various states of the transistors depicted in FIG. 2 as a function of the state of the input signal. The circuit depicted in FIG. 2 and characterized by the table shown in FIG. 3.

DETAILED DESCRIPTION

Figure 2:
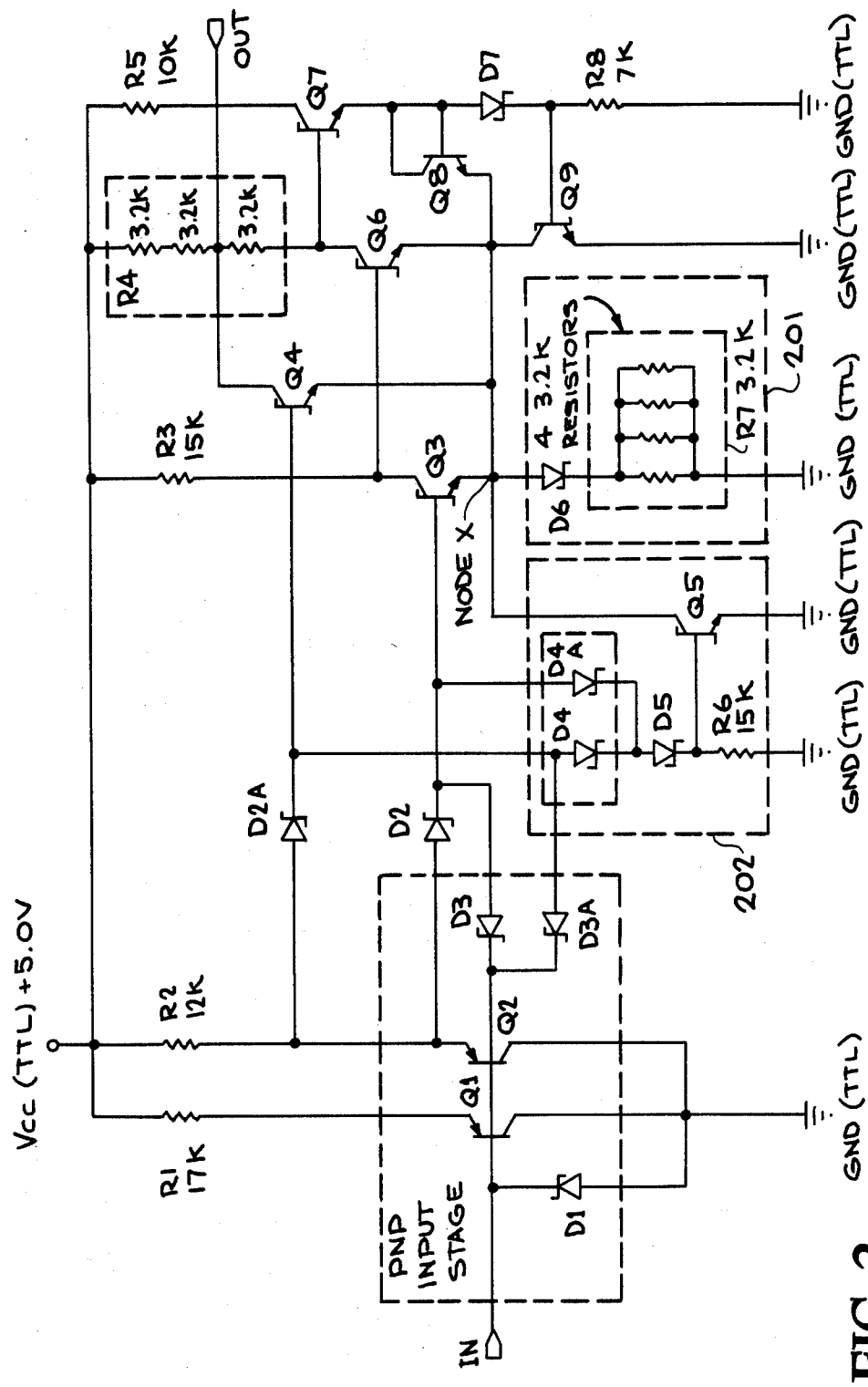
FIG. 2 depicts the detailed circuit diagram for the temperature compensated, high performance hysteresis buffer taught herein.

Referring to FIG. 1a, a typical prior art hysteresis buffer, 101, is shown in combination with a 48 milliamp output buffer, 102, NPN input stage 103 and buffer 125. This circuit arrangement is operative to invert the signal input on line 120. An analagous circuit arrangement that does not invert the input is depicted in FIG. 1b. The only difference between the circuit depicted in FIG. 1a and FIG. 1b is the inclusion of inverter 104 in the FIG. 1b circuit.

It should be observed that in these known circuit arrangements, the hysteresis feedback loop is not separate from the data path. As a result, the threshold values, $V_{IL}$ and $V_{IH}$, may be affected by variables in the output stage such as output current. Thus, the hysteresis window, defined herein as the difference between $V_{IL}$ and $V_{IH}$ over the operating temperature range of the hysteresis circuit, is dependent on current delivered to the load via output buffer 102.

In addition to being output dependent, the hysteresis window, as defined hereinbefore, is inherently a function of temperature. The hysteresis window of the known circuit arrangements varies considerably with temperature. This is because temperature sensitive components, such as Schottky diodes, are typically used to fabricate the circuits As a result, not only the load, but swings in temperature as well, will have a significant impact on the degree to which the hysteresis window of known circuits will vary. In short, the known circuits are unreliable at best, if not altogether useless, in situations where widely varying loads and temperatures are present.

Still further, the known circuit arrangements depicted in FIGS. 1a and 1b suffer a time delay before a threshold level can be changed. This is because the hysteresis feedback loop is output dependent. Any required switching follows the output serially.

To solve the aforementioned problems, and by way of comparison, FIGS. 1c and 1d are presented, in block diagram form, to depict hysteresis buffer circuits arranged according to the preferred embodiment of the invention. In FIG. 1c it may be seen that a PNP input stage, 180, replaces the NPN input stage of the prior art circuit. This will reduce $I_{IL}$ and improve the circuits input characteristics.

FIG. 1c also depicts hysteresis buffer circuitry 181 with a first signal path, 185, being fedback to the PNP input stage 180 and a second separate signal path, path 186, being used to couple data (via inverter 187) to output buffer 188. FIG. 1d is the same as FIG. 1c, except that a noninverter circuit arrangement is shown.

The separate feedback and data paths shown in FIGS. 1c and 1d speed up switching the threshold levels in the novel circuits. Less time delay is suffered in switching hysteresis reference levels since the switching takes place in parallel with data being propagated to the output stage. In addition, the separate paths for data and for signals to control the hysteresis reference levels, eliminates the problem of having the threshold levels being affected by variables in the output stage. It will be demonstrated, with reference to FIG. 2, that a minimum predetermined hysteresis window is guaranteed over wide termperature ranges using the temperature compensation and current switching techniques taught hereinafter.

FIG. 2 depicts the circuit details of a hysteresis buffer that functions as an inverter. The circuitry depicted in FIG. 2 corresponds to the functional block 199 shown in dashed lines in FIG. 1c. The example set forth hereinafter, for constructing the FIG. 1c inverter circuit in accordance with the teachings of the invention, may easily be modified by one skilled in the art to realize the noninverter buffer shown in FIG. 1d.

Referring now to FIG. 2, according to the preferred embodiment of the invention, the head of the feedback/threshold level adjustment path is PNP transistor Q1. The head of the signal path carrying data is PNP transistor Q2. These paths are hereinafter defined as the first signal path and second signal path respectively. The PNP input stage is clearly shown in FIG. 2 comprised of Q1 and Q2.

The first signal path, including the loop which carries feedback to the PNP input stage, includes all the components shown in FIG. 2., except those components in the separate second signal path as it is hereinafter defined. The first signal path components taken together operate as the threshold adjustment means of the preferred embodiment. The threshold adjustment means of the preferred embodiment of the invention is more particularly defined to include temperature compensation string 201; anti-hysteresis killer means 202; and self-compensating resistors R4 and R7 comprised of multiple resistors each having the same resistance value; all depicted in FIG. 2.

The second signal path, as depicted in FIG. 2, is comprised of PNP transistor Q2, Schottky diode D2A, and transistor Q4. This signal path couples the input, labled "in", to the circuit's output labeled "out". The input signal is propagated along the second signal path to the output stage (not shown in FIG. 2) which is coupled to "out". The inversion of the input signal may, for example, be performed by an inverter (like inverter 187 shown in FIG. 1c) being inserted between the hysteresis buffer and the output buffer.

To appreciate the operation of the first signal path, reference should be made to FIGS. 2 and 3 together. This will enable one to see in tabular form (from FIG. 3) the state of the various circuit components depicted in FIG. 2 as a function of the input as being "low" or "high" as these terms are hereinafter defined.

For the sake of illustration only, the circuit will be defined in accordance with TTL standards. Accordingly, the circuit depicted in FIG. 2 operates with $V_{CC}$ defined as $+5.0V$; with an input signal of greater then $+2.0V$ defined as "high"; with an input signal of less then $+0.8V$ defined as "low"; with the Schottky diodes defined as "on" at $+0.5V$; and with $V_{BE}$ at $+0.8V$ and $V_{CE}$ at $+0.3V$ when the transistors shown in FIG. 2 are characterized as "on" in the table depicted in FIG. 3.

Further constraints and definitions to serve the purposes of the example and to meet the aforesaid specifications for military applications are that $V_{IH}$ cannot be greater than $+2.0V$; $V_{IL}$ cannot be less then $+0.8V$; and although $V_{IH}$ and $V_{IL}$ vary, their difference (i.e., the window between $V_{IH}$ minimum and $V_{IL}$ maximum) must always be greater then 200 millivolts over the temperature range of −55° C. to 155° C.

The key elements and functions performed by the circuit depicted in FIG. 2 are set forth in detail immediately hereinafter.

According to the preferred embodiment of the invention, the aforesaid temperature compensation string 201, is comprised of Schottky diode D6 and resistor R7. The purpose of temperature compensation string 201 is to keep the voltage drop relatively constant between node "X" (shown in FIG. 2) and ground over the anticipated operating temperature range of the circuit.

According to the instant example the range is 210° C. The temperature coefficients of Schottky diode D6 and of resistor R7 are opposite and therefore achieve the purpose of the string.

The circuit depicted in FIG. 2 has the higher threshold, $V_{IH}$, set when the input signal is low; i.e., $V_{IH}$ is set when transistor Q9 is off and current goes to ground via the temperature compensation string D6 and R7. The lower threshold, $V_{IL}$, is set when Q9 is on and current goes to ground via Q9. This occurs when the input signal is high.

It should be noted that a key feature of the invention is realized by the circuit depicted in FIG. 2 because current switching between the D6, R7 string and Q9 is triggered by swings in the input signal; but is output independent.

It should also be noted that the hysteresis window is set up by switching current between D6 and Q9. This hysteresis window is guaranteed to be at least 200 millivolts over the circuits operating range because of the temperature compensation string/current switching means (Q9) combination. The voltage drop across R7, D6 and Q9 is approximately one Schottky drop. The Q9 drop is approximately one Schottky drop since the $V_{CE}$ of Q9 is clamped by Q8 and D7 to be equal to the drop of D7; the D6 drop is one Schottky drop; and the voltage drop across R7 is also approximately one Schottky drop as will become obvious with reference to formula (2) set forth hereinafter where $V_{R7}$ is calculated. As a result the difference between the voltage drop across Q9 and the voltage drop across R7 and D6 is approximately one Schottky drop which is always above 200 millivolts.

FIG. 2 also depicts the threshold adjustment means as being further comprised of anti-hysteresis killer means 202. Means 202 is shown comprised, of transistor Q5, resistor R6 and Schottky diodes D4, D4A and D5. This string serves to sink current if the signal at the base of transistor Q3 exceeds two Schottky drops plus $V_{BE}$. The anti-hysteresis string's purpose is to prevent node X from continuing to rise when switching from the $V_{IH}$ to $V_{IL}$ threshold, i.e., the circuit serves to stem the rising voltage at node X as the input voltage swings from low to high. Means 202 has the overall net effect of speeding up the hysteresis buffer, facilitating quick switching of threshold levels.

Finally, with respect to the hysteresis buffer depicted by FIG. 2, it should be observed that $V_{R7}$ is independent of both the process variation used to fabricate the resistors shown in FIG. 2 and is independent of the temperature coefficients of these resistors. In the preferred embodiment, as shown in FIG. 2, R7 is comprised of four 3.2K ohm resistors in parallel while R4 is comprised of three 3.2 ohm resistors in series. The algebraic calculation of $V_{R7}$, to be described in detail hereinafter, will show the temperature coefficients and process variables associated with the resistors used to fabricate R4 and R7, cancelling out, therefore achieving the aforesaid self-compensating feature. One of ordinary skill in the art will appreicate that the resistance values used herein are for the sake of illustration only. By way of further example, if it is desirable to widen the hysteresis window, this can be accomplished by choosing a greater value for R7 then the value used in the example of the preferred embodiment. The only condition is that the resistors have the same dimension.

As indicated hereinbefore, an overview of the various states of the transistors used to fabricate the preferred embodiment of the invention is set forth in tabular form in FIG. 3.

One of ordinary skill in the art will appreciate that when the input signal supplied to the hysteresis buffer circuit is "low", only Q1, Q2 and Q6 are "on". This is shown in the first line of the table set out in FIG. 3. In this case, $V_{IH}$ is set and Q9 is off forcing current to ground via D6 and R7. The output in this case is pulled high by the output buffer to achieve the inverter function.

As shown in the second line of the table depicted in FIG. 3, when the input to the hysteresis buffer circuit is "high", Q3, Q4, Q7 Q8 and Q9 are "on". The output from the circuit depicted in FIG. 2 is now low, since transistor Q4 pulls the buffer output low when turned on. Further, $V_{IL}$ is set since Q9 is on forcing current to ground via Q9 instead of the D6, R7 string.

Finally, it can be seen from FIG. 2 and FIG. 3 together that as the input swings from low to high, $V_{IL}$ is determined by Q3 turning on, Q6 turning off, Q7 turning on and Q8 and Q9 turning on. When the input voltage swings from high to low, the end result is that Q6 is left on, everything else (except Q1 and Q2) are turned off, and current is forced through D6 and R7 to ground to set $V_{IH}$.

The following analysis will prove that although $V_{IH}$ will vary with temperature over the 210° C. range between −55° C. and 155° C. it will not exceed +2.0V. That $V_{IL}$ does not fall below +0.8V will be demonstrated hereinafter. Obviously, if $V_{IH}$ were allowed to exceed +2.0V or if $V_{IL}$ were allowed to be less than +0.8V, the unacceptable prospect that the input signal could change states without crossing a threshold level would exist. Accordingly, these performance requirements are incorporated in the preferred embodiment of the invention. Furthermore, the hysteresis window will always exceed 200 millivolts as was demonstrated hereinbefore with reference to the voltage drops across the temperature compensation string/current switching means combination.

To show $V_{IH}$ does not exceed +2.0V, consider the voltages developed across R7 at −55° C. and 155° C. (the extremes) and the formula:

$$V_{IHMAX} = 2V_{SCH} + V_{R7} \qquad (1)$$

One of ordinary skill in the art, using published tables, would determine that $V_{SCH}$ at −55° C. is approximately +0.7 volts. $V_{SCH}$ at 155° C. is approximately +0.4 volts. To calculate $V_{R7}$, one may start with the equations:

$$I_{R4} = \frac{V_{CC} - V_{SCH} - V_{SAT} - I_{R7}R7}{R4}$$

and

-continued $$I_{R3} = \frac{V_{CC} - V_{SCH} - V_{BE} - I_{R7}R7}{R3}.$$

Since $I_{R7} = I_{R3} + I_{R4}$ (the sum of the current at node $X$);   (2)

$$I_{R7} = \frac{V_{CC} - V_{SCH} - V_{SAT}}{R4} + \frac{V_{CC} - V_{SCH} - V_{BE}}{R3} -$$

$$\frac{I_{R7}R7}{R3} - \frac{I_{R7}R7}{R3}; \text{ therefore,}$$

$$I_{R7} = \left[ \frac{V_{CC} - V_{SCH} - V_{SAT}}{R4} + \frac{V_{CC} - V_{SCH} - V_{BE}}{R3} \right].$$

$$\left[ \frac{1}{1 + \frac{R7}{R4} + \frac{R7}{R3}} \right]; \text{ and thus,}$$

$$V_{R7} = \left[ \frac{V_{CC} - V_{SCH} - V_{SAT}}{R4} + \frac{V_{CC} - V_{SCH} - V_{BE}}{R3} \right].$$

$$\left[ \frac{R7}{1 + \frac{R7}{R4} + \frac{R7}{R3}} \right].$$

to calculate the range of $V_{IH}$ at $V_{CC} = +5.0V$, first at $-55°$ C. and then $155°$ C., begin by calculating $V_{R7}$ using formula (2), and then substitute in formula (1), set forth hereinbefore, using the table values for $V_{SAT}$, $V_{BE}$ and $V_{SCH}$ at the extreme temperatures of interest i.e., for $-55°$ C. and $155°$ C. respectively.
At $155°$ C.:

$$V_{R7} = \left[ \frac{5 - .4 - .2}{10K} + \frac{5 - .4 - .55}{15K} \right] (.706) = .5013V;$$

therefore,
$V_{IH155°}$
$C. = 2(V_{SCH}) + V_{R7} = 2(0.4) + (0.5013) = 1.3013V$ and at $-55°$ C.:

$$V_{R7} = \left[ \frac{5 - .7 - .35}{10K} + \frac{5 - .7 - .95}{15K} \right] (.706) = .4365V;$$

therefore, $V_{IH-55°} C. = 2(V_{SCH}) + V_{R7}$
$= 2(0.7) + 0.4365 = 1.8365V.$

Thus, the maximum value for $V_{IH}$ is less the $+2.V$ over the $210°$ C. operating temperature range of the circuit used in the preferred embodiment of the invention.

To appreciate that $V_{IL}$ always exceeds $+0.8V$, consider that $V_{IL}$ is equal to $V_{CE}$ of Q9 plus $V_{BE}$ of Q3 plus $V_{SCH}$ of D2 less $V_{BE}$ of Q1. Therefore, $V_{IL}$ is approximately 2 $V_{SCH}$, which is always greater then $+0.8V$ over the aforesaid temperature range.

One of ordinary skill in the art will appreciate that the formulas set forth hereinbefore demonstrate that $V_{R7}$ is independent of both process variation and the temperature coefficients of the various resistors (as stated hereinbefore) since the use of multiple resistors having the same value to fabricate R4 and R7 allows process variation dependent parameteres and temperature coefficients to cancel out.

What has been set forth herein is a novel hysteresis buffer circuit which realizes all of the objectives set forth hereinbefore. In particular, the hysteresis circuit disclosed is output independent, meets the aforementioned minimum hysteresis requirements over temperature ranges suitable for military applications, operates with a relatively low $I_{CC}$ and $I_{IL}$ and is self-compensating.

The foregoing description of a preferred embodiment of the novel methods and apparatus for achieving the objects of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the instant invention and its practical application to thereby enable others skilled in the art to best utilize the instant invention in various embodiments and with various modifications as are suited to the particular use contemplated. It is intended that the scope of the instant invention be defined by the claims appended hereto.

What is claimed is:

1. A temperature compensated hysteresis buffer comprising:
    (a) means for receiving an input signal inherently representing data;
    (b) means for outputting data inherently represented by said input signal;
    (c) first signal path means coupled to said means for receiving an input signal, including a hysteresis feedback loop, for setting hysteresis reference levels as a function of said input signal, wherein said hysteresis feedback loop further includes threshold adjustments means for performing output data level independent current switching to set said hysteresis reference levels and further wherein said threshold adjustment means includes a series temperature compensation circuit, combined with means for performing current switching as a function of said input signal, for keeping a first voltage drop across said series circuit relatively constant independent of temperature; and
    (d) second signal path means, separated from said first signal path means, coupled to said means for recieving an input signal end to said means for outputting data, for protagating said data to said means for outputting.

2. Apparauts as set forth in claim 1 further comprising a PNP transistor input stage, wherein said hysteresis feedback loop, of said first signal path means, and said second signal path means are coupled to said means for receiving an input signal via said input stage, and further wherein said input stage is used to drive said first and second signal paths in parallel in response to said input signal and feedback on said loop.

3. Apparatus as set forth in claim 2 wherein said temperature compensation circuit further comprises the series combination of a Schottky diode and means for developing a first resistance, wherein said Schottky diode and said means for developing a first resistance have opposite temperature coefficeients.

4. Apparatus as set forth in claim 3 wherein said threshold adjustment means further comprises means for developing a second resistance combined with said means for performing current switching.

5. Apparatus as set forth in claim 4 wherein said means for performing current switching comprises a transistor.

6. Apparatus as set forth in claim 4 wherein the difference between a voltage drop across said temperature compensation circuit and a voltage drop across said means for performing current switching is sufficient to guarantee a minimum preselected hysteresis window over a predetermined operating temperature range for the hysteresis buffer.

7. Apparatus as set forth in claim 4 wherein said means for developing a first resistance and said means for developing a second resistance are self compensating, whereby the temperature coefficients and process variables associated with the resistive components used to fabricate each of said first and second resistances are cancelled out whenever said resistances are connected in series.

8. Apparatus as set forth in claim 7 wherein said means for developing said first and second resistance values are comprised of a plurality of resistors, each resistor having the same resistance value and physical dimension, coupled in parallel to fabricate said means for developing a first resistance, and coupled in series to fabricate said means for developing a sescond resistance.

9. Apparatus as set forth in claim 1 wherein said threshold adjustment means further comprises anti-hysteresis killer means for speeding up the operation of said buffer to facilitate quick switching between said hysteresis reference levels.

10. Apparatus as set forth in claim 6 wherein said hysteresis reference levels comprise a first and second predetermined threshold voltage, $V_{IL}$ and $V_{IH}$ respectively.

11. Apparatus as set forth in claim 10 having a 210° C. operating range between −55° C. and 155° C.

12. Apparatus as set forth in claim 11 wherein the absolute value of the difference between $V_{IL}$ and $V_{IH}$ exceeds 200 millivolts over said predetermined operating temperatures range for the hysteresis buffer.

13. Apparatus as set forth in claim 12 wherein said buffer is fabricated as a single semiconductor integrated circuit device.

14. A method for adjusting the hysteresis reference levels in a temperature compensated hysteresis buffer, independent of the output data level of said buffer, comprising the steps of:
 (a) receiving an input signal inherently representative of data via input means;
 (b) outputting data inherently represented by said input signal via output means;
 (c) setting hysteresis reference levels as a function of said input signal, utilizing a first signal path which is output data level independent and includes a hysteresis feedback loop, wherein said step of setting is performed by combining a series temperature compensation circuit with means for performing output data level independent current switching as a function of said input signal; and
 (d) propagating said data to said means for outputting data utilizing a second signal path separate from said first signal path.

15. A method as set forth in claim 14 further comprising the steps of:
 (a) coupling said input signal and feedback on said hysteresis feed back loop to a PNP transistor input stage; and
 (b) driving said first and second signal paths via said PNP input stage in response to said input signal and feedback on said loop.

16. A method as set forth in claim 15 wherein said step of setting is performed in parallel with the step of propagating data to said output means.

17. A method as set forth in claim 16 wherein said step of setting includes the step of performing an anti-hysteresis killer function in order to speed up the operation of said buffer to facilitate quick switching between said hysteresis reference levels.

18. A methos as set forth in claim 14 wherein said hysteresis reference levels comprises a first and second predetermined threshold voltage, $V_{IL}$ and VIH respectively.

19. A method as set forth in claim 18 wherein said buffer is operative over the 210° C.temperature range betwen −55° C.and 155° C.

20. A method as set forth in claim 18 wherein the absolute valuee of the difference between $V_{IL}$ and $V_{IH}$ exceeds 200 millivolts over a predetermined operating temperature range for the hysteresis buffer.

* * * * *